US009581313B2

(12) United States Patent
Finsterbusch et al.

(10) Patent No.: US 9,581,313 B2
(45) Date of Patent: Feb. 28, 2017

(54) LIGHTING APPARATUS

(75) Inventors: Klaus Finsterbusch, Berlin (DE);
Ulrich Hartwig, Berlin (DE)

(73) Assignee: OSRAM GmbH, Munich (DE)

( * ) Notice: Subject to any disclaimer, the term of this patent is extended or adjusted under 35 U.S.C. 154(b) by 195 days.

(21) Appl. No.: 14/001,116

(22) PCT Filed: Feb. 7, 2012

(86) PCT No.: PCT/EP2012/052038
§ 371 (c)(1),
(2), (4) Date: Aug. 22, 2013

(87) PCT Pub. No.: WO2012/113644
PCT Pub. Date: Aug. 30, 2012

(65) Prior Publication Data
US 2013/0329426 A1    Dec. 12, 2013

(30) Foreign Application Priority Data
Feb. 23, 2011   (DE) ......................... 10 2011 004 574

(51) Int. Cl.
*F21V 9/00*    (2015.01)
*F21V 13/08*   (2006.01)
(Continued)

(52) U.S. Cl.
CPC .............. *F21V 13/08* (2013.01); *F21K 9/64* (2016.08); *F21V 9/16* (2013.01); *F21V 17/02* (2013.01);
(Continued)

(58) Field of Classification Search
CPC .......... F21V 13/08; F21V 13/14; F21V 17/02; F21V 9/16; F21V 9/10; F21V 7/08;
(Continued)

(56) References Cited

U.S. PATENT DOCUMENTS 7,232,228 B2 *   6/2007  Li  .................................  353/102
7,618,158 B2 *  11/2009  Li  .............................  362/296.01
(Continued)

FOREIGN PATENT DOCUMENTS

CN          101836160       9/2010
JP          2012-013898     1/2012
(Continued)

*Primary Examiner* — Jason Moon Han
(74) *Attorney, Agent, or Firm* — Cozen O'Connor

(57) ABSTRACT

A lighting apparatus has a light source emitting primary light; a reflector device with first and second focal points; a rotatable light wheel with two functional regions; a primary light device irradiated by the light source and having functionally assigned to it one of the functional regions as a primary light functional region, the first focal point being located at the primary light device; a utility light device to which is functionally assigned another of the functional regions as a utility light functional region, the second focal point being located at the utility light device; a primary light functional region having in a first rotational position of the light wheel at least one phosphor sensitive to the primary light; and a utility light functional region being transmissive to the light whose wavelength is converted by the primary light functional region.

11 Claims, 6 Drawing Sheets

(51) Int. Cl.
*F21V 9/16* (2006.01)
*G02B 7/00* (2006.01)
*H04N 9/31* (2006.01)
*G03B 21/20* (2006.01)
*F21V 17/02* (2006.01)
*F21V 7/08* (2006.01)
*F21V 9/10* (2006.01)
*F21V 13/14* (2006.01)
*F21Y 101/00* (2016.01)

(52) U.S. Cl.
CPC ............ *G02B 7/006* (2013.01); *G03B 21/204* (2013.01); *H04N 9/3114* (2013.01); *F21V 7/08* (2013.01); *F21V 9/10* (2013.01); *F21V 13/14* (2013.01); *F21Y 2101/00* (2013.01); *F21Y 2115/30* (2016.08)

(58) Field of Classification Search
CPC .. F21K 9/56; F21K 9/64; G02B 7/006; G03B 21/204; H04N 9/3114
USPC ....... 362/235, 293, 84, 296.06, 296.07, 231, 362/230, 240, 249.03, 277, 296.01, 307, 362/311.02, 327

See application file for complete search history.

(56) References Cited

U.S. PATENT DOCUMENTS

| | | |
|---|---|---|
| 2004/0145312 A1 | 7/2004 | Ouderkirk et al. |
| 2007/0019408 A1* | 1/2007 | McGuire et al. ............ 362/231 |
| 2009/0027631 A1* | 1/2009 | Liu et al. ..................... 353/84 |
| 2009/0034284 A1* | 2/2009 | Li et al. ....................... 362/554 |
| 2009/0284148 A1* | 11/2009 | Iwanaga ...................... 313/506 |
| 2010/0097779 A1 | 4/2010 | Gladnick et al. |
| 2012/0201030 A1* | 8/2012 | Yuan et al. .................. 362/293 |

FOREIGN PATENT DOCUMENTS

| | | |
|---|---|---|
| JP | 2012-032553 | 2/2012 |
| JP | 2012-084234 | 4/2012 |
| JP | 2014-506719 | 3/2014 |
| WO | WO 2006/133214 | 12/2006 |
| WO | WO 2012/075947 | 6/2012 |

* cited by examiner

LIGHTING APPARATUS

RELATED APPLICATIONS

This is a U.S. national stage of International application No. PCT/EP2012/052038 filed on Feb. 7, 2012.

This application claims the priority of German application no. 10 2011 004 574.0 filed Feb. 23, 2011, the entire content of which is hereby incorporated by reference.

FIELD OF THE INVENTION

The invention relates to a lighting apparatus having at least one first light source for emitting primary light, a reflector device with a first focal point and a second focal point, and at least one light wheel, rotatable about a rotation axis, with at least two functional regions of which one can be irradiated by means of the at least one light source, a functional region that can be irradiated by means of the at least one light source having, in a predetermined rotational position of the light wheel, at least one phosphor that is sensitive to the primary light emitted by the light source and converts wavelengths.

BACKGROUND OF THE INVENTION

In the case of projection applications based on the fundamentally known LARP ("Laser activated remote phosphor") technique, a phosphor is irradiated by a laser and the irradiated light is partially converted by means of the phosphor into a wavelength-converted or frequency-converted utility light, and partially scattered back without a wavelength conversion. A primary pump light generated by the laser need not be used, or need not be continuously used, directly as utility light. In order to generate a wavelength-converted utility light that is pure during the irradiation of the phosphor, it is necessary for the pump light component of unconverted wavelength to be filtered out at this time. A rotating filter wheel with optical filters such as is known from projector applications can provide a assistance here.

If use is made of a rotating phosphor wheel in order to carry the phosphor, something which is particularly advantageous for an efficient wavelength conversion given high pump light intensities (from approximately 5 W/mm$^2$), there is a need for a total of two rotating wheels, specifically the filter wheel and the phosphor wheel, to be synchronized with one another. This signifies a high technical outlay.

SUMMARY OF THE INVENTION

It is an object of the present invention to overcome the disadvantages of the prior art at least in part and, in particular, to provide a lighting apparatus that uses at least one wavelength-converting phosphor and provides an at least partially sequentially generated mixed light in conjunction with a lower technical outlay.

This and other objects are attained in accordance with one aspect of the present invention directed to a lighting apparatus having at least one first light source for emitting light ("primary light"), a reflector device with at least one first focal point and a second focal point, at least one rotatable light wheel with at least two functional regions, a primary light device that can be irradiated by means of the at least one light source, the primary light device having functionally assigned to it one of the functional regions (as a "primary light functional region"), and the first focal point being located in the region of the primary light device, and a utility light device to which is functionally assigned another of the functional regions (as a "utility light functional region"), the second focal point being located in the region of the utility light device, a primary light functional region assigned to the primary light device having, at least in a first rotational position of the light wheel, at least one phosphor that converts the wavelength of the primary light emitted by the light source, and a utility light functional region assigned to the utility light device being transmissive at least to the light whose wavelength is converted by the primary light functional region.

This lighting apparatus has the advantage that a particularly compact and versatile configuration which, in addition, manages with a low number of components is possible because of the use of both focal points to irradiate light onto functional regions of the light wheel. Synchronization of different wheels is eliminated owing to the use of the rotatable light wheel which can take over the functions both of a filter wheel and of a phosphor wheel. The light wheel can also be denoted as a functional region carrier.

The use of a light wheel has the advantage that the use of the wavelength conversion by at least one of the light sources enables a simpler and most cost effective generation of light of a further color, specifically a color of converted wavelength, than only employing light from light sources (that is to say without any sort of use of wavelength conversion). On the other hand, to make use of at least one light source without a downstream wavelength conversion as opposed to using only one light source and a wavelength conversion therefrom into, optionally, a plurality of colors is advantageous for a more simple and more precise setting of an overall color locus of the mixed light emitted by the lighting apparatus. In addition, it is possible thereby to decrease a thermal load on the light region carrier from Stokes losses during the wavelength conversion, and this reduces thermally conditioned displacements of a wavelength of a wavelength-converted light, and also reduces the dimensions of a "thermal quenching", and prevents a thermally induced degradation of the phosphor. This enables lighting characteristics that are stable in the short and the long term.

The at least one first light source is, in particular, directed onto the first focal point so as to enable a focal spot on the current primary light functional region at or in the vicinity of the first focal point even without the use of an upstream optics, and/or if the primary light device has no optics upstream of the assigned primary light functional region.

The at least one first light source is preferably narrow-band, in particular a monochromatic or quasi-monochromatic light source of small bandwidth, in particular a laser-type light source.

At least one light source is preferred that has one or more lasers or laser light sources of the same or different wavelength or color. A lighting apparatus thus configured can also be denoted as a LARP ("Laser Activated Remote Phosphor") device. The laser light source can, in particular, comprise at least one semiconductor laser, in particular a diode laser or laser diode. This can be of particularly compact and robust configuration. It is also possible to operate laser diodes together in groups simply, for example as a laser stack.

Alternatively, by way of example, the at least one light source can comprise one or more light emitting diodes. At least one light emitting diode can be present in the form of at least one individually housed light emitting diode, or in the form of at least one LED chip. A plurality of LED chips can be mounted on a common substrate (submount). The at least one light emitting diode can be equipped with at least one dedicated and/or common optics for beam guidance, for example at least one Fresnel lens, collimator, and so on. It is also possible in general to make use of organic LEDs (OLEDs, for example polymer OLEDs), e.g. on the basis of InGaN or AlInGaP, instead of, or in addition to, inorganic light emitting diodes.

The at least one light source can, furthermore, comprise at least one broadband light source (for example a light emitting diode chip with downstream phosphor conversion, a superluminescent diode, an incandescent lamp or a discharge lamp), downstream of which can be connected at least one optical filter.

Light of different color comprises, in particular, light of a different peak wavelength and/or a different bandwidth.

The reflector device can have at least one reflector. The reflector device can, in particular, have exactly one reflector. The reflector device can, furthermore, have at least one further optical element such as, for example, at least one collimating lens.

For example, the reflector device may have a collimating lens downstream of the first focal point that directs light incident from the first focal point onto a plane mirror as the reflector element. The plane mirror can reflect this light onto a second lens, which focuses the light further onto the second focal point.

There is a configuration in which the light of the at least one first light source comprises or is blue light and/or ultraviolet light, in particular in a wavelength region of equal to or less than 460 nm, in particular of approximately 445 nm. Thus, it is possible to easily provide light over substantially the entire visible light spectrum, specifically particularly by means of a wavelength conversion to greater wavelengths ("down conversion"), for example from blue or UV to green.

An (optical) functional region can be understood as any region of the light wheel that is provided and set up for the purpose of influencing light incident on it.

Thus, at least one functional region can have at least one phosphor ("phosphor region"), in particular in the case of use as a primary light functional region.

The phosphor region or its phosphor is capable of at least partially converting the wavelength of light emitted by the light source. This can, in particular, comprise absorbing a portion of the light, irradiated by the light source onto the phosphor region, from at least one phosphor of the phosphor region, and reemitting it with a changed, in particular greater ("down-converting") or lesser ("up-converting") wavelength (for example from blue to yellow or from red to green). Another portion of the light can be emitted from the phosphor region again without conversion of the wavelength. It is thereby possible to emit a monochromatic light irradiated by the assigned light source from the phosphor region as mixed light (as a combination of the wavelength-converted component and the non-wavelength-converted component). Such a functional region can have, in particular, a phosphor layer. With reference to its thickness and/or a concentration of the at least one phosphor, a phosphor layer of the phosphor region can be specifically set such that it is also consequently possible to specifically set a wavelength-converted component. In particular, the irradiated light can be substantially completely wavelength-converted by means of a sufficiently high phosphor concentration and/or a sufficiently large thickness. This can correspond, in particular, to a conversion level of at least approximately 95%, in particular of at least approximately 98%, in particular of at least approximately 99%.

The wavelength conversion can, for example, be carried out on the basis of a luminescence, in particular photoluminescence or radioluminescence, in particular phosphorescence and/or fluorescence. However, by way of example, the wavelength conversion can also be carried out by means of nonlinear effects such as frequency multiplication as well as splitting the photon energy, for example in optically parametric oscillators.

The light whose wavelength is converted by the at least one phosphor can, in particular, again be emitted diffusely, and this enables a high intensity homogeneity and wide irradiation of a possibly downstream optical element.

Given the presence of a plurality of phosphors, an incident light wheel can be converted at least partially into light of different wavelengths or wavelength regions.

At least one functional region can be provided and set up as a reflecting, in particular diffusely reflecting, region (reflection region), in particular when used as a primary light functional region. This enables effective focusing of the primary light onto the second focal point and subsequent specific decoupling from the lighting apparatus. In turn, this enables direct use of the primary light as utility light, in particular for mixing light or as a color component of a mixed light generated by the lighting apparatus. Such a reflection region can, for example, have a reflecting, in particular diffusely reflecting, layer.

At least one functional region can be provided and set up as an optically filtering region (filter region), in particular when used as a utility light functional region. Such a filter region can, for example, comprise a plate or film that optically filters a specific wavelength or waveband or wavebands. Use of a dichroic mirror is also possible. Such a filter region enables the decoupling of a color pure or color purified light as utility light.

At least one functional region can be provided and set up as a region ("window region") that is transmissive to light and in particular transparent or translucent (in particular, a region which transmissively scatters or is transmissively beam-widening). Said region enables light transmission largely without losses.

The primary light device can, in particular, be a device for influencing the incident primary light, a specific primary light functional region being functionally assigned to the primary light device at a specific instant or at a specific rotational position of the light wheel. At different instances or given different rotational positions, the primary light device can be assigned different functional regions on the basis of the relative rotation of the light wheel with reference to the stationary first focal point. In other words, the primary light region can be assigned that primary light functional region which is located at or in the vicinity of the first focal point.

The primary light device may, in particular, be assigned only at least one (in particular temporally changing) primary light functional region. In other words, the primary light device may currently consist only of that primary light functional region which is located precisely at or in the vicinity of the first focal point. It is particularly simple and cost effective to produce this configuration. Specifically in this case, the feature that the lighting apparatus has a primary light device that can be irradiated by means of the at least one light source, the primary light device being functionally assigned one of the functional regions as a primary light functional region, and the first focal point being located in the region of the primary light device, may mean that it is possible for the at least one light source to irradiate a primary light functional region which is located at or in the vicinity of the first focal point.

In a development, at least one optics can be upstream and/or downstream of the primary light functional region, it being preferred that the primary light functional region is located at or in the region of the first focal point.

The utility light device can, in particular, be a device for influencing a light reflected by the reflector device, a specific utility light functional region being functionally assigned to the utility light device at a specific instant or at a specific rotational position of the light wheel. At different instances or given different rotational positions, the utility light device can be assigned different functional regions on the basis of the relative rotation of the light wheel with reference to the stationary second focal point.

The utility light device may, in particular, be assigned only at least one (in particular temporally changing) utility light functional region. In other words, the utility light device may consist only of that utility light functional region which is located at or in the vicinity of the second focal point. It is particularly simple and cost effective to produce this configuration. Specifically in this case, the feature that the lighting apparatus has a utility light device (that can be irradiated in particular by means of the at least one reflector device), the utility light device being functionally assigned one of the functional regions as a utility light functional region, and the second focal point being located in the region of the utility light device, may mean that it is possible for the at least one reflector device to irradiate a utility light functional region which is located at or in the vicinity of the second focal point.

In a development, at least one optics can be upstream and/or downstream of the utility light functional region, it being preferred that the utility light functional region is located at or in the region of the first focal point.

In general, it can be a preferred configuration that the first focal point is located at or in the vicinity of the primary light functional region assigned to the primary light device, and/or that the second focal point is located at or in the vicinity of the utility light functional region assigned to the utility light device.

For the case that it is not a functional region (in particular utility light functional region), but an optics upstream of the functional region, that is located in or at the second focal point, it is a possible variant that the light wheel is lowered at least at this functional region. This enables simple positioning of the upstream optics at the assigned (in particular second) focal point.

The lighting apparatus can generally assume a plurality of functionally different rotational positions for which different functional regions or an optics upstream thereof can be located at the two focal points.

There is also a configuration such that the primary light functional region assigned to the primary light device has, at least in a (for example "first") rotational position of the light wheel, at least one phosphor which converts the wavelength of the primary light emitted by the first light source, and the utility light functional region assigned to the utility light device is transmissive at least to the light whose wavelength is converted by the primary light functional region. Consequently, as utility light the lighting apparatus can emit at least partially wavelength-converted light and, if appropriate, also non-wavelength-converted light. This is because, at or in the vicinity of the first focal point, in particular, the primary light is irradiated onto the primary light functional region, which is configured as a phosphor region and, via the reflector device, focuses wavelength-converted light and, typically, a (possibly small) portion of a light which is only scattered, but not wavelength-converted, onto the second focal point, where the utility light functional region transmissive at least to the wavelength-converted light is located.

There is also a configuration such that the utility light functional region assigned to the utility light device is, in the first rotational position, nontransmissive to the primary light, i.e. the utility light functional region acts in particular as an optical filter (absorption filter, dichroic mirror or a combination thereof, or the like), which only transmits the wavelength-converted light.

There is also a development that the light wheel has a plurality of primary light functional regions in the form of a plurality of phosphor regions with different phosphors which can be, in particular, arranged in segments on the light wheel. Given a rotational operation of the light wheel, it is thus possible to use at least one light source to sequentially irradiate different phosphor regions and, consequently, generate as utility light a sequential light sequence, in particular color succession, assembled from the light emitted by the lighting regions. Owing to an inertia of the human eye, the sequential light sequence is perceived as mixed light given a sufficiently high rotational rate of the light wheel (for example of more than 25 rotations per second). Owing to the plurality of phosphor regions, it is possible to define a large adjustable lighting region (gamut). For example, it is possible to use lighting regions which react sensitively to UV light and convert it into visible light, for example in the combinations of red/green/blue (for example by means of three phosphor regions), mint green/red (for example by means of two phosphor regions) or red/green/blue/yellow (for example by means of four phosphor regions).

It is also a configuration that, at least in a further (for example "second") rotational position of the light wheel, the primary light functional region assigned to the primary light device is configured to reflect, in particular diffusely, the primary light emitted by the light source, and that the utility light functional region assigned to the utility light device is transmissive at least to the primary light. The primary light can thus also be used as utility light directly (without a wavelength conversion), in particular for mixing light.

It is also a configuration that the light wheel has a plurality of primary light functional regions and a plurality of utility light functional regions, the primary light functional regions being arranged as segments of a first ring, and the utility light functional regions being arranged as segments of a second ring. The first and the second ring can, in particular, be arranged concentrically relative to the rotation axis of the light wheel. The first and the second ring preferably do not overlap one another. The first ring can, in particular, be an inner ring, while the second ring is an outer ring. Alternatively, the first ring can be an outer ring while the second ring is an inner ring. The rings rotate during a rotational operation of the light wheel, in particular below the respective focal spots.

It is also a further configuration that the (in particular all the) functional regions are overarched by the reflector device. This is possible, in particular, given a reflector that is, in particular, elliptical and has a high eccentricity, or given a reflector assembled from two parabolic half shells, in the case of which the two focal points can be arranged placed apart comparatively far from one another. The reflector can be of unipartite or multipartite configuration. Such a lighting apparatus enables comparatively wide focal spots. It is also possible in this case for the focal points to be present on regions of the light wheel that are reflected on the rotation axis. It is advantageous for a rapid transition between different rotational positions that (pairs of) primary light functional regions and utility light functional regions associated with a specific rotational position have an alignment rotated by 180° about the rotation axis, said regions in particular being of different sizes, but having a preferably identical shape.

It is an alternative configuration that at one instant only a portion of the functional regions is overarched by the reflector device. This is possible, in particular, given a reflector of low eccentricity for which the two focal points are spaced apart comparatively slightly from one another. Such a lighting apparatus enables a particularly compact design. For a rapid transition between different rotational positions, it is advantageous in this case that (pairs of) primary light functional regions and utility light functional regions associated with a specific rotational position have an identical alignment with reference to the rotation axis, said regions in particular being of different sizes, but preferably having an identical shape.

It is also a configuration that the lighting apparatus has at least one second light source for emitting (second) primary light onto the primary light device, in particular onto the assigned primary light functional region. This configuration enables a particularly flexible design. It is a specific configuration that the second primary light has a color different from the primary light of the at least one first light source. It is thereby possible to decouple a color component which can be generated only with difficulty, or even not at all, by the first primary light or by a wavelength conversion generated by the first primary light.

It is also a configuration that the least one first light source irradiates the primary light device from a side ("from above") facing the reflector device, the at least one second light source irradiates the primary light device from a side ("from below") averted from the reflector device. In this case, a lighting spot can result on the side facing the reflector device at or in the vicinity of the first focal point, particularly on the assigned primary light functional region. In particular (in an associated "further" rotational position) the primary light functional region, irradiated by the at least one second light source (and associated with the primary light device), of the primary light device can be transmissive, in particular transparent or translucent, to the second primary light, and the utility light functional region assigned to the utility light device can be transmissive, in particular transparent or translucent, to the light of the at least one second light source. Consequently, in this further rotational position the second primary light can be decoupled particularly easily and precisely as utility light from the lighting apparatus, and in particular can be added as additional color component to the mixed light. Alternatively the associated primary light functional region can also have a thin layer with a phosphor sensitive to the second primary light.

It is a particularly advantageous configuration that the light of the first light source comprises or is blue light (for example with a peak wavelength of approximately 445 nm), and/or ultraviolet light. In particular, the light of the second light source can comprise or be red light. Particularly in combination, it is thereby possible to provide a large color space in conjunction with a comparatively low heat generation by virtue of Stokes losses. The high Stokes losses otherwise arising from a wavelength conversion from UV or blue to red are avoided.

Alternatively, the at least one second light source can irradiate the primary light device from above, the light paths of the at least one first light source and the at least one second light source preferably being combined upstream of the reflector device for the purpose of a compact design. A primary light functional region assigned to the primary light device can then be a reflecting primary light functional region, for example including the primary light functional region already reflecting the first primary light. The associated utility light functional region assigned to the utility light device is transmissive at least to the primary light generated by the at least one second light source, and can, for example, also be the utility light functional region already transmitting the first primary light.

It is also a configuration that a primary light functional region assigned to the primary light device is, at least in one rotational position, transmissive to the primary light emitted by the at least one first light source, and there is a common optical combiner downstream of the primary light device and the utility light device. The primary light can also thus be decoupled as utility light from the lighting apparatus without a reflection in the reflector device.

It is also a development that at least one of the light sources can be operated in clocked fashion and in a manner tuned to a rotational position or angular position of the light wheel. Thus, the light of the light source(s) can be restricted specifically to desired regions or sections of the light wheel. This enables, firstly, a targeted setting of a lighting duration and thus brightness of a specific functional region. It is thus also possible, for example, to easily vary an overall color locus of the mixed light. Moreover, as compared with a continuous operation of the light source(s), it is thus possible to provide a lighting apparatus which is more energy efficient, generates less heat and has a longer service life.

BRIEF DESCRIPTION OF THE DRAWINGS

In the following figures, the invention is described in more detail schematically with the aid of exemplary embodiments. In this case, identical or identically acting elements can be provided with identical reference symbols for the sake of clarity.

In the drawings.

DETAILED DESCRIPTION OF THE DRAWINGS

Figure 1:
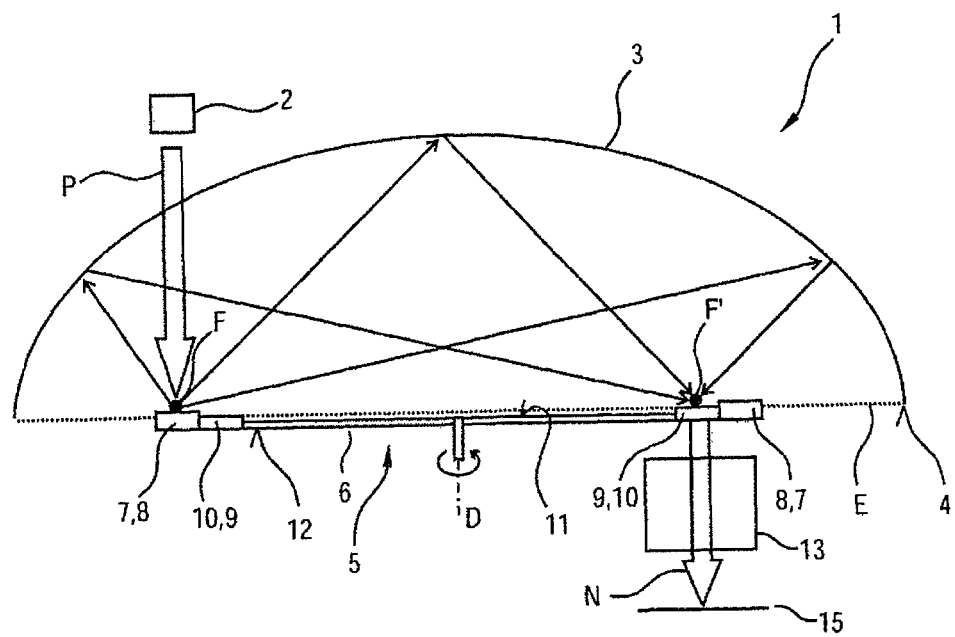
FIG. 1 shows a sectional illustration in side view of a lighting apparatus in accordance with a first embodiment, with a light wheel.

FIG. 1 shows a sectional illustration in side view of a lighting apparatus 1 in accordance with a first embodiment. The lighting apparatus 1 has a first light source in the form of a laser 2 that emits light in the form of (first) primary light P. The laser 2 can, for example, be a "blue laser" emitting blue light as the primary light P, or a "UV laser" emitting UV light as the primary light P.

The lighting apparatus 1 further has as reflector device an elliptically shaped reflector 3 with a first focal point F and a second focal point F'. The focal points F, F' lie here on or in the vicinity of a light exit plane E defined by a free edge 4 of the reflector.

The reflector 3 overarches a light wheel 5 whose basic shape is that of a circular disk, and which can be rotated with reference to its rotation axis D, for example by means of a drive motor (not illustrated). The reflector 3 has a sufficiently high eccentricity for this purpose.

Figure 2:
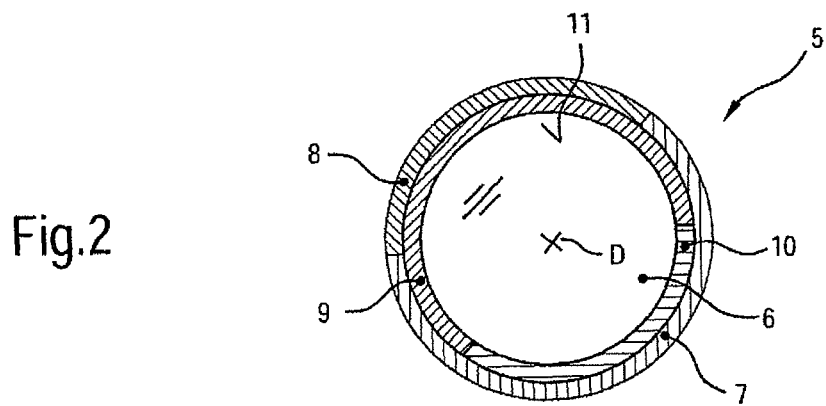
FIG. 2 shows in plan view the light wheel of the lighting apparatus in accordance with the first embodiment.

The light wheel 5 is shown in plan view in FIG. 2. The light wheel 5 has a circular disk-shaped carrier 6 that has four functional regions 7, 8, 9, 10 in the shape of ring segments, specifically a first, outer functional region 7, a second, outer functional region 8 adjoining thereto in complementary fashion, a third, inner functional region 9 and a fourth, inner functional region 10 adjoining thereto in complementary fashion. The outer functional regions 7 and 8 together form an outer concentric ring about the rotation axis D, and the inner functional regions 9 and 10 together form an inner concentric ring about the rotation axis D with a diameter that is smaller than that of the outer ring 7, 8. The outer ring 7, 8 and the inner ring 9, 10 abut one another here purely by way of example. The outer ring 7, 8 and the inner ring 9, 10 have a basic shape rotated about the rotation axis D by 180°. The functional regions 7 to 10 have specific functions with reference to light incident on them, one or more of the functional regions 7 to 10 also being able to have a plurality of functions, for example depending on a rotational position of the light wheel 5 and/or a type (e.g. color) of the light.

The rotation axis D can, in particular, run through the geometric and physical centroid of the light wheel 5.

Referring once again to FIG. 1, the laser 2 radiates primary light P through an opening in the reflector 3 onto a top side 11 facing the reflector 3. Here, the laser 2 can radiate onto one of the outer functional regions 7 and 8, specifically depending on the current rotational position of the light wheel 5 about the rotation axis D. The outer functional regions 7 and 8 thus correspond to primary light functional regions which are acted upon by the primary light P in the region of the first focal point F. The focal spot generated by the laser 2 on one of the outer functional regions 7 and 8 is located at or in the vicinity of the first focal point F of the reflector 3.

At the same time, an inner functional region 9 or 10 shaped in a complementary fashion and rotated by 180° about the rotation axis D is located at or in the vicinity of the second focal point F' such that light emitted by the functional region 7 or into the reflector 3 is reflected by the latter onto the functional region 9 or 10. The functional regions 9 and 10 therefore correspond to utility light functional regions.

Optionally provided downstream of the inner ring 9, 10 at the location of the second focal point F' is an optics 13 that receives and influences light penetrating through the inner ring 9, 10 at the location of the second focal point F'. The optics 13 can, for example, comprise a light mixer, a concentrator, a collimator, a lens etc. or a combination thereof.

Here, there is optionally a diaphragm opening or aperture 15 downstream of the optics 13.

The primary light device is formed here by that outer functional region 7 or 8 which serves as primary light functional region and is currently located at or in the vicinity of the first focal point F or is being irradiated by the first laser 2. Thus, depending on the rotational position, one of the outer functional regions 7 and 8 (which constitute the primary light functional regions) is assigned to the primary light device.

The utility light device is formed analogously by that inner functional region 9 or 10 which serves as utility light functional region and is currently located at or in the vicinity of the second focal point F or is mainly irradiated by the reflector 3. Thus, depending on the rotational position, one of the inner functional regions 9 and 10 (which represent the utility light functional regions) is assigned to the utility light device.

The mode of operation of the lighting apparatus 1 will now be described in more detail with the aid of a variant in which the first, outer functional region 7 has a wavelength-converting phosphor sensitive to the primary light P, for example converting from blue to green or UV to green. The first, outer functional region 7 can, for example, be formed by means of a phosphor layer formed on the top side 11 of the carrier 6.

The second, outer functional region 8 is configured to reflect the primary light P, in particular diffusely reflecting or scattering light. To this end, the second, outer functional region 8 can, for example, be present in the form of a reflecting layer applied to the top side 11 of the carrier 6.

The third, inner functional region 9 is designed to be nontransmissive to (for example filtering or blocking) the primary light P, and to be transmissive for the wavelength-converted light. The third, inner functional region 9 can, for example, be present in the form of an optical filter (for example a filter film) which covers a cutout in the carrier 6. The optical filter can, for example, be a dichroic mirror and/or an absorption filter, specifically in a fashion integrated in one element or as a combination of various elements.

The fourth, inner functional region 10 is configured transmissively, at least for the primary light P. The fourth, inner functional region 10 can, for example, be present in the form of a transparent film which covers a cutout in the carrier 6.

The light wheel 5 can here assume essentially two rotational positions: specifically, a first rotational position in which the first, outer functional region 7 is located at the focal point F, and the third, inner functional region 9 is located at the second focal point F', and a second rotational position, in which the second, outer functional region 8 is located at the focal point F, and the fourth, inner functional region 10 is located at the second focal point F'.

It follows that in the first rotational position the first, outer functional region 7 can be irradiated in the region of the first focal point F by the primary light P. The primary light P is at least partially converted to a wavelength-converted light and reflected by means of the reflector 3 to the third, inner functional region 9. At the third, inner functional region 9, the wavelength-converted portion of the light is transmitted as utility light N, and the primary light component is filtered out or blocked out. Consequently, at an underside 12 of the third, inner functional region 9 and thus of the light wheel 5 it is essentially only the wavelength-converted utility light N which exits and therefore traverses the optics 13 to the aperture 15.

In the second rotational position, the primary light P is reflected at the second, outer functional region 8 and, by means of the reflector 3, to the fourth, inner functional region 10, which it traverses. After traversing the optics 13, light corresponding to the primary light P therefore reaches the aperture 15 as utility light N.

Given a rotation of the light wheel 5, it follows that it is possible to alternately provide light of a wavelength or a wavelength region of the wavelength-converted light, and light of a wavelength or a wavelength region of the primary light P. Given a sufficiently rapid sequence, these light sequences are perceived by a human observer as mixed light with components from these two wavelengths. The maximum length of the respective sequence is prescribed by the length of the functional regions 7 to 10. In one variant, the laser 2 can be operated in clocked fashion so that it emits light not only continuously (in continuous wave operation), but also for shorter times prescribed by the clock pulse. A color coordinate of the mixed light can thus be set on a curve in the color space prescribed by the two wavelengths or colors.

In order to generate a mixed light from more than two wavelengths or wavelength regions or colors, the first, outer functional region 7 can have a plurality of different phosphors that convert the primary light P into light of different wavelengths (for example from blue into green, yellow and/or red or from UV into blue, green, yellow and red). Alternatively, a plurality of annular subsegments with respective phosphors can be used instead of a uniform first, outer functional region 7.

Figure 3:
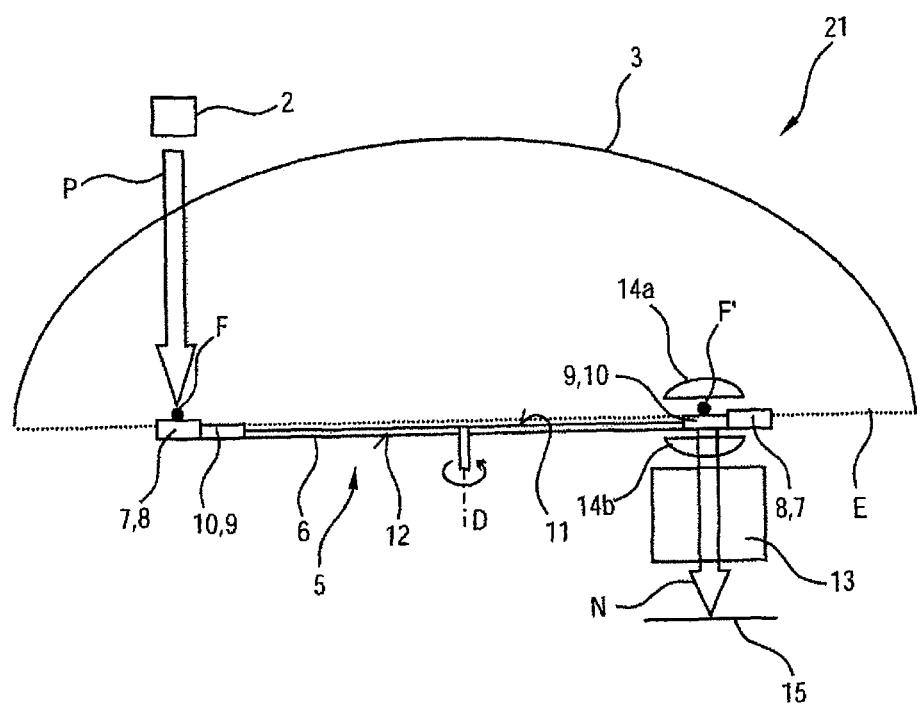
FIG. 3 shows a sectional illustration in side view of a lighting apparatus in accordance with a second embodiment.

FIG. 3 shows a lighting apparatus 21 in accordance with a second embodiment as a sectional illustration in side view. The lighting apparatus 21 is designed in a similar fashion to the lighting apparatus 1, except that in the region of the second focal point F' an optics 14a designed, by way of example, as a lens is now upstream of the inner ring 9, 10, and an optics 14b designed, by way of example, likewise as a lens is downstream of said ring. Together with the inner functional region 9 or 10 currently at or in the vicinity of the second focal point F', the optics 14a and 14b form the utility light device. The utility light device is upstream of the optics 13. The inner functional regions 9 and 10 can be utilized particularly effectively with this lighting apparatus 21.

Figure 4:
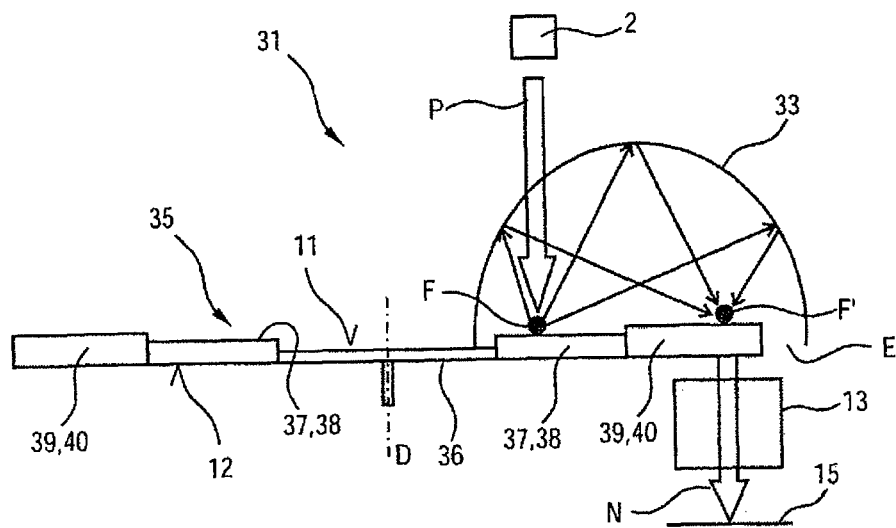
FIG. 4 shows a sectional illustration in side view of a lighting apparatus in accordance with a third embodiment.

FIG. 4 shows a lighting apparatus 31 in accordance with a third embodiment as a sectional illustration in side view. By contrast with the reflector 3 of the lighting apparatus 1, the reflector 33 used here has a low eccentricity, and so its focal points F and F' lie comparatively near one another. Consequently, the reflector 33 can no longer completely cover the light wheel 35 having carrier 36, but only continue to do so partially. This partial covering is configured such that (depending on the rotational position of the light wheel 5) only a portion of the functional regions 37 to 40 is overarched by the reflector 33. The lighting apparatus 31 can be of particularly compact configuration.

Figure 5:
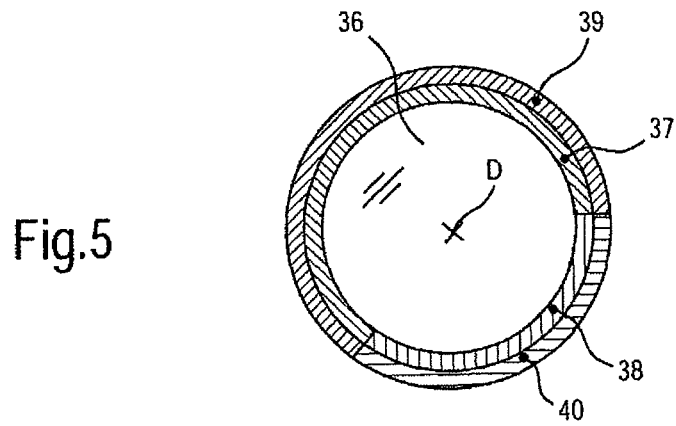
FIG. 5 shows in plan view the light wheel of the lighting apparatus in accordance with the third embodiment.

As shown in FIG. 5, functional regions 37 to 40 are also designed here as ring segments of rings arranged concentrically about a rotation axis D of the light wheel 35 having carrier 36. However, the laser 2 shown in FIG. 4 now radiates onto the inner ring 37, 38 formed by a first, now inner functional region 37 and a second, now inner functional region 38. The first, inner functional region 37 and the second, inner functional region 38 correspond functionally to the functional regions 7 and 8. A third, now outer functional region 39 and a fourth, now likewise outer functional region 40 correspond to the functional regions 9 and 10.

Apart from the arrangement, interchanged with reference to the light wheel 5, between inside and outside, (pairs of) functional regions 37 and 39 or 38 and 40 located simultaneously at the respective focal point F or F' are arranged in a similar angular sector with reference to the rotation axis D. The inner ring 37, 38 and the outer ring 39, 40 are therefore essentially identical in shape and position, but not the same size.

The light wheel 35 can therefore essentially assume two rotational positions: specifically, a first rotational position in which the first, inner functional region 37 is located at the first focal point F, and the third, outer functional region is located at the second focal point F', and a second rotational position, in which the second, inner functional region 38 is located at the first focal point F, and the fourth, outer functional region 40 is located at the second focal point F'. The mode of operation of the lighting apparatus 31 is then analogous to that of the lighting apparatus 1, and can also be similarly developed.

Figure 6:
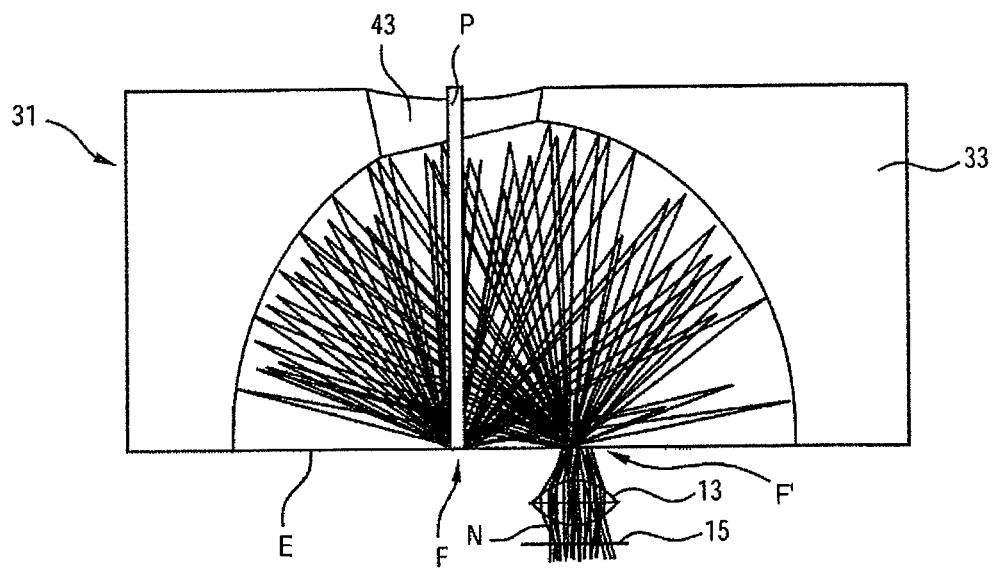
FIG. 6 shows a sectional illustration in side view of parts of the lighting apparatus according to the third embodiment in greater detail together with calculated light paths.

FIG. 6 shows a sectional illustration in side view of parts of the lighting apparatus 31 in greater detail together with calculated light paths. The reflector 33 has a light entrance opening 43 for entrance of the primary light P. The light entrance opening 43 can be silvered on one side, in order to prevent a reentry back into the light entrance opening 43 of light running in the reflector 33. The primary light P is directed onto the first focal point F, at which the inner ring 37, 38 (not illustrated) of the light wheel 35 is located. Emanating from the first focal point F are light paths that are represented by continuous lines and result from a diffuse scattering of the inner ring 37, 38. The light paths are reflected by means of reflector 33 onto the second focal point F', in the region of which they traverse the light wheel 35 (in filtered or unfiltered fashion). The utility light N that has traversed the light wheel 35 runs further through the optics 13, designed here as a biconvex lens, and still further through the aperture 15.

Figure 7:
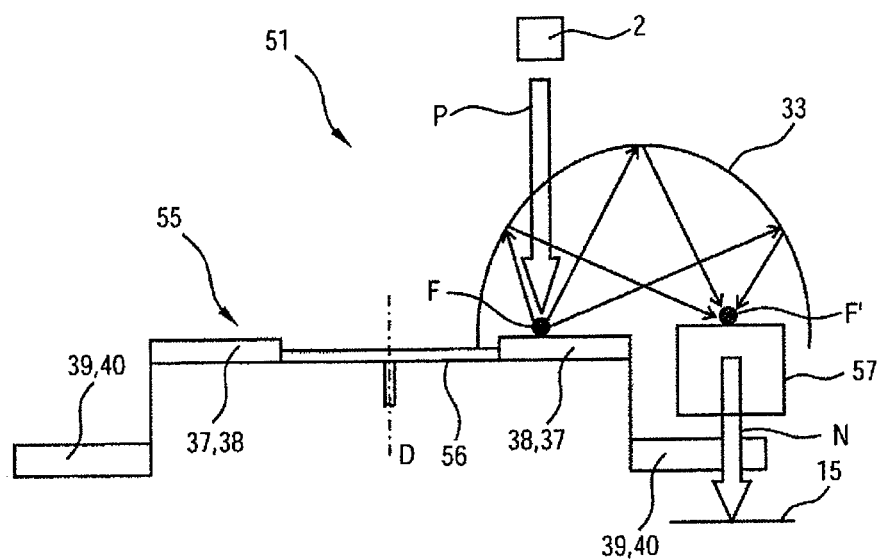
FIG. 7 shows a sectional illustration in side view of a lighting apparatus in accordance with a fourth embodiment.

FIG. 7 shows a sectional illustration in side view of a lighting apparatus 51 in accordance with a fourth embodiment. The lighting apparatus 51 is similar to the lighting apparatus 31 apart, now, from the fact that the carrier 56 of the light wheel 55 is lowered at its edge region, which carries the outer ring 39, 40. Furthermore, a stationary optics 57 is upstream of the outer ring 39, 40 in the region of the second focal point F', specifically outside the reflector 33. Consequently, it is no longer the outer ring 39, 40 that is located at the second focal point F' or at a slight distance beneath the second focal point F', but a light entrance surface 58 of the upstream optics 57, which directs the incident light onto the lowered outer ring 39, 40. Consequently, the useful light device can have at least the upstream optics 57 and the inner ring 39, 40 and the functional regions 39, 40 thereof, and the carrier 56 is lowered at least at the utility light device 39, 40, 57.

Instead of the carrier 56 lowered in steps in profile, it is also possible to use two light wheels, arranged in parallel, that are longitudinally spaced apart with reference to a common rotation axis D, a light wheel located closer to the reflector 33 having, in particular, a lesser diameter, and carrying the inner ring 37, 38. The other light wheel, spaced further apart from the reflector 33, has a greater diameter and carries the outer ring 39, 40. Since these several light wheels can be permanently fastened on a common drive shaft, a mutual synchronization is also lacking here.

Figure 8:
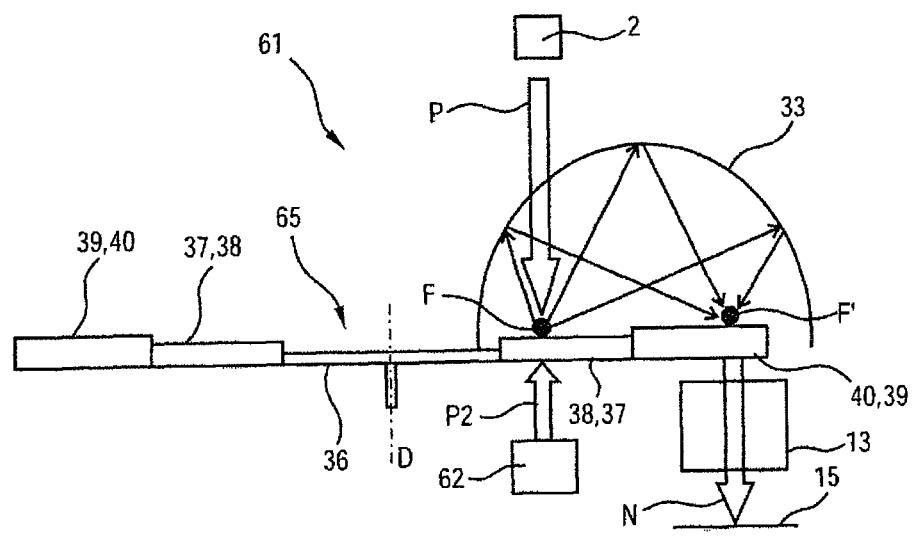
FIG. 8 shows a sectional illustration in side view of a lighting apparatus in accordance with a fifth embodiment.

FIG. 8 shows a sectional illustration in side view of a lighting apparatus 61 in accordance with a fifth embodiment. The lighting apparatus 61 is constructed in a fashion similar to the lighting apparatus 31. The lighting apparatus 61 additionally has a second light source in the form of a second laser 62 for emitting a second primary light P2. The second primary light P2 has a different color (different peak wavelength(s) and/or different bandwidth(s)) than the (first) primary light P emitted by the laser 2, and also a different color than the light whose wavelength is converted by means of the first functional region 37. The second laser 62 radiates onto an underside 12 of the light wheel 65 having carrier 36, specifically onto a further primary light functional region 69, which is transmissive to the second primary light P2 and is located in a further rotational position at or in the vicinity of the focal point F. Consequently, the second primary light P2 is irradiated from below through the further primary light functional region 69, and generates a focal spot on the side facing the reflector 33 at or in the vicinity of the first focal point F. Consequently, the second primary light P2 is irradiated into the reflector 33 at the first focal point F. The further primary light functional region 69 can, in particular, have a scattering effect such that the second primary light P2 emerging on the side facing the reflector 33 is widened.

In the further rotational position, it is possible, in particular, for there to be present at the second focal point F' a utility light functional region that is transmissive to the wavelength or the waveband of the second primary light P2. By way of example, this can be the fourth, outer functional region 40, which is already transmissive to the wavelength or the waveband of the first primary light P. Alternatively, a dedicated utility light functional region can be present.

The further primary light functional region 69 can, in particular, correspond to the second, inner functional region 38, which is designed to reflect the first primary light P. In this case, the first laser 2 and the second laser 62 can be operated simultaneously at the same primary light functional region 38, 69. The second, inner functional region 38 can be formed in this case, in particular, by means of a dichroic mirror. A mixed light formed from the first primary light P and the second primary light P2 can then emerge as the utility light N at least temporarily at the associated fourth, outer functional region 40. In order to set a color coordinate of the mixed light, it is possible both for the first laser 2 and the second laser 62 to be operated in such a fashion that they can be activated/deactivated or switched on/switched off in a fashion that is clocked or controlled.

The further primary light functional region 69 can, alternatively, correspond to a further, inner primary light functional region which differs from the other inner (primary light) functional regions 37, 38. Such a further, inner primary light functional region 69 can be designed to be transmissive to light, for example transparent or translucent, in particular diffusive, both to the first primary light P and to the second primary light P2. Such a configuration is particularly cost effective. In this case, it is advantageous that the first laser 2 emits no first primary light P when the further primary light functional region 69 is located at the first focal point F. In general, it can then be advantageous that lasers 2 and 62 can be activated or switched on only alternately (operation in phase opposition). The first, inner functional region 37 and the second, inner functional region 38 can, in particular, have a blocking effect on the second primary light P2.

The use of the second laser 62 has the advantage that it is possible to mix into the mixed light in a simple way a color component that can be generated by means of a phosphor and only one primary light source only with difficulty, or not at all, for example because of an absence or a low efficiency of phosphors.

It is also possible thus to suppress a heating of the light wheel 65 by Stokes losses in a phosphor, a thermal displacement of a peak wavelength of a wavelength-converted light, and a thermal quenching of a phosphor. This is particularly advantageous if the peak wavelength of the second primary light P2 is far distant from the peak wavelength of the first primary light P. For example, the first primary light P may be UV light or blue light, and the second primary light P2 may be red light or even infrared (IR) light.

As an alternative to irradiation from below onto the side of the light wheel 65 averted from the reflector 33, the second laser 62 may be directed from above onto the top side 11 of the light wheel 65. For this purpose, the second primary light P2 of the second laser 62 can be guided separately by the first primary light P, or be combined therewith, for example by using a beam combiner arranged upstream of the reflector 33, and subsequently using the same light entrance opening 43.

When use is made of a plurality (that is to say also of more than two) light sources, in particular lasers, the color of the lasers is not restricted. Thus, the first laser 2 may be a laser that emits light with a peak wavelength of approximately 445 nm and for which phosphors with a high conversion efficiency exist. The second laser 62 may be a laser emitting red light. In particular, there may further be present at least one further laser which irradiates the light wheel 65 from below, for example, and which can, for example, emit blue light with a peak wavelength in a region between 460 nm and 470 nm, in order to be able to generate a mixed light that is particularly pleasant to human perception.

In general, it is possible to use a plurality of first lasers 2 (in general: light sources) which can also emit light of different colors.

Figure 9:
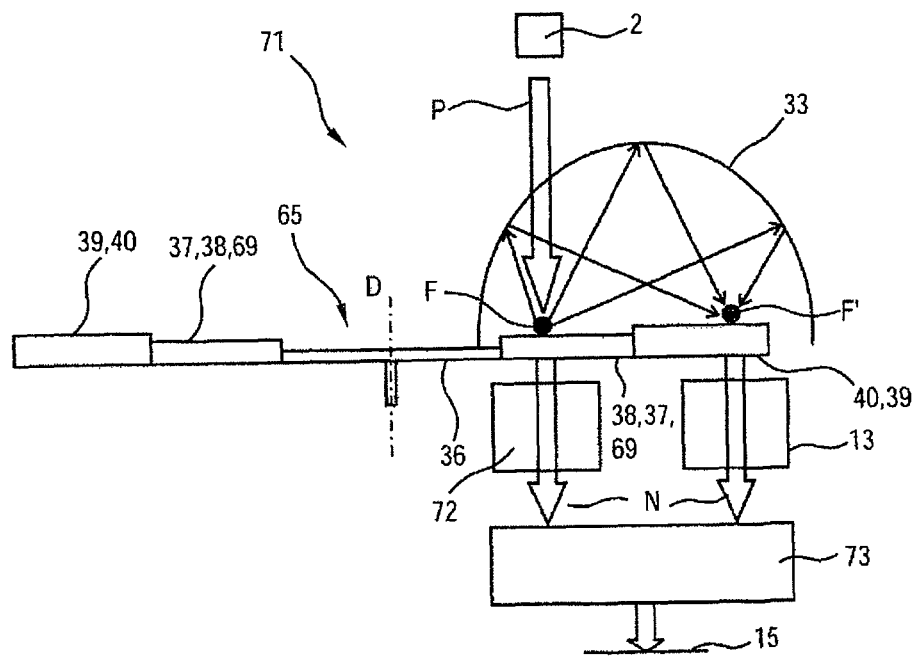
FIG. 9 shows a sectional illustration in side view of a lighting apparatus in accordance with a sixth embodiment.

FIG. 9 shows a sectional illustration in side view of a lighting apparatus 71 in accordance with a sixth embodiment. The lighting apparatus 71 is constructed in a fashion similar to the lighting apparatus 31, e.g., having a light wheel 65 with a carrier 36, except that now the second, inner functional region 38 is transmissive to the primary light P and it is optionally possible to dispense with the fourth, outer functional region 40.

Consequently, in the second rotational position the primary light P irradiated by the laser 2 is passed outwards directly through the second, inner functional region 38, here onto an optionally present, downstream optics 72. In the first rotational position and in the second rotational position, the utility light N is therefore decoupled from the reflector 33 at different points, specifically at the focal point F' or at the focal point F (separate utility light channels), specifically with different colors. In order to generate a (sequential) mixed light with the aid of the lighting apparatus 71, the optics 13 assigned to the focal point F' and the optics 72 assigned to the focal point F are upstream of a common optical combiner 73 which combines the utility light beams emanating from the optics 13 and 72, and leads them to the aperture 15. The combiner 73 can, for example, be constructed by means of one or more dichroic mirrors, since the colors of the light of the separate utility light channels differ.

Figure 10:
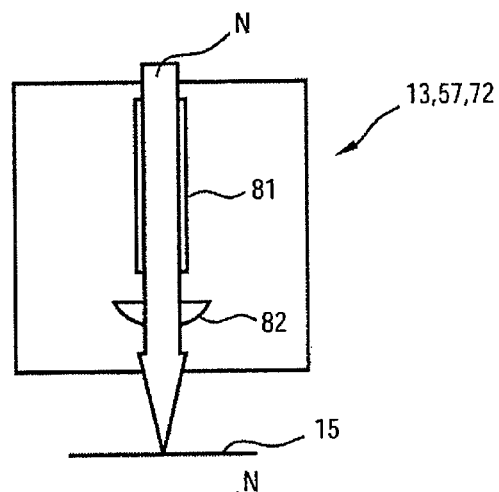
FIG. 10 shows a sectional illustration in side view of a configuration of an optics for one of the lighting apparatuses according to one of the first to sixth embodiments.

FIG. 10 shows a sectional illustration in side view of a possible configuration of the optics 13, 57 and/or 72, in particular for one of the lighting apparatuses 1, 21, 31, 51, 61 and 71.

By way of example, in order to influence, in particular shape and/or homogenize, the incident utility light N the optics 13, 57 and/or 72 can firstly have a light tunnel 81 downstream of which there is an imaging optics 82. The light tunnel 81 may, in particular, serve to homogenize and align in parallel the incident utility light, and can be present, for example, in the form of a cylindrical light mixing rod, optical conductor or hollow channel. The imaging optics 82 can, for example, have one or more lenses. The optics 13, 57 and/or 72 may also have only the light tunnel 81 or only the imaging optics 82.

The utility light wheel can be set in a simple and compact way to a specific size of the aperture 15 and/or to specific acceptance angle regions by means of the configuration of the optics 13, 57 and/or 72 that has been shown.

Figure 11:
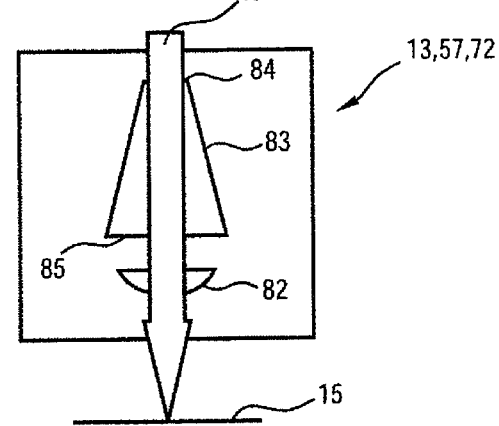
FIG. 11 shows a sectional illustration in side view of a further configuration of an optics for one of the lighting apparatuses according to one of the first to sixth embodiments.

FIG. 11 shows a sectional illustration in side view of a further possible configuration of the optics 13, 57 and/or 72. Instead of the cylindrical light tunnel 81, use is made here of a light tunnel 83 whose light entrance surface 84 is smaller than its light exit surface 85. The light tunnel 83 can, for example, be present in the form of a light mixing rod that widens in a frustoconical fashion in the light propagation direction, optical conductor or hollow channel.

Figure 12:
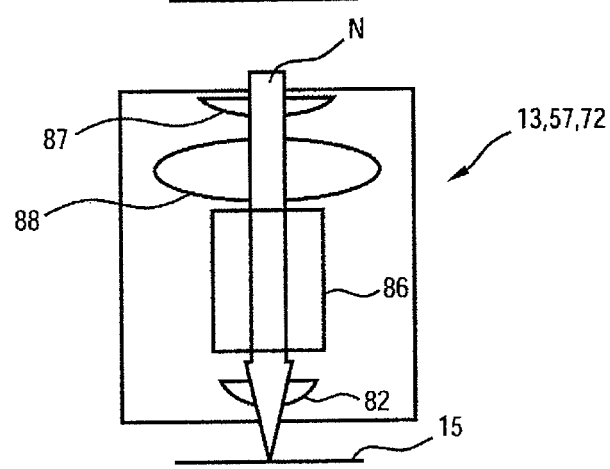
FIG. 12 shows a sectional illustration in side view of yet a further configuration of an optics for one of the lighting apparatuses according to one of the first to sixth embodiments.

FIG. 12 shows a sectional illustration in side view of yet a further possible configuration of the optics 13, 57 and/or 72. Here, a plurality of lenses 87, 88 are upstream optically in series of a cylindrical light tunnel 86, the result being that the light tunnel 86 can be of comparatively wide configuration.

Of course, the present invention is not restricted to the exemplary embodiments shown.

Thus, the assignments of the functional regions to an inner or an outer ring and/or to one of the focal points F and F' can also be interchanged.

Instead of the lasers, it is also possible to use other light sources, if appropriate in combination with a suitable optics, for example light emitting diodes etc.

Furthermore, the number, arrangement and/or function of the functional regions is not restricted. Thus, light wheels with only one ring or with three or yet more rings may also be used; alternatively, it is also possible to use a plurality of light wheels each having a different diameter, or the like.

In general, features of the different embodiments can also be used alternatively or in addition to one another.

In particular, the lighting apparatuses can respectively be equipped with reflectors of great or slight eccentricity. Thus, in accordance with the lighting apparatus of the fourth embodiment, the light wheel with the partially lowered carrier may also be used in a lighting apparatus that has a reflector of high eccentricity, for example in accordance with the lighting apparatus of the first or the second embodiment.

Again, more than two light sources of different colors may be used, for example two or more light sources of different colors whose light is at least partially wavelength-converted, and/or two or more light sources of different colors whose light is not wavelength-converted.

In general, the wavelengths or colors (including ultraviolet and infrared) of the light sources and of the wavelength-converted light are not restricted. In particular, light can be understood as an electromagnetic wave comprising UV light, visible light and IR light, in particular in a spectral region between 10 nm and 1 mm.

A further general development is that the first light source emits blue light with a peak wavelength of approximately 445 nm, since this produces a high wavelength conversion efficiency. A second light source, whose light is, in particular, not wavelength-converted, may emit blue light with a peak wavelength of approximately 460-470 nm, which enables a color emission perceived as purely blue. In addition, a light source which radiates in red may be used, in particular.

By way of example, the lighting apparatus may thus emit blue (445 nm)/green-converted light, and/or blue (445 nm)/red-converted light, as well as blue (460-470 nm) primary light and/or red primary light, or a combination thereof.

The reflector can, for example, consist of metal or glass that is reflectively coated. The reflector can be of unipartite or multipartite design. The reflector can have a dichroic coating, in particular on its inside, which is designed to be transmissive to the primary light P, and to reflect the utility light as well as the second primary light P2 (if present).

The invention claimed is:

1. A lighting apparatus comprising:
   at least one first light source for emitting primary light;
   a reflector device with a first focal point and a second focal point;
   a rotatable light wheel having a first functional region arranged as a first ring of the light wheel and a second functional region arranged as a second ring of the light wheel;
   a primary light device comprising the first functional region of the rotatable light wheel arranged to be irradiated by the at least one first light source, said first functional region of the light wheel functioning as a primary light functional region of the primary light device, and the first focal point being located at the primary light device; and
   a utility light device comprising the second functional region of the rotatable light wheel, said second functional region of the light wheel functioning as a utility light functional region of the utility light device, the second focal point being located at the utility light device,
   wherein the lighting apparatus is configured to rotate the light wheel between a first rotational position and a second rotational position, such that:
   (a) in the first rotational position of the light wheel:
      (i) the first functional region of the light wheel has, in the primary light functional region of the primary light device, at least one phosphor adapted to convert the wavelength of the primary light emitted by the light source, and
      (ii) the second functional region of the light wheel is, in the utility light functional region of the utility light device, transmissive at least to the light whose wavelength is converted by the at least one phosphor of the first functional region of the light wheel, and
   (b) in the second rotational position of the light wheel:
      (i) the first functional region of the light wheel, in the primary light functional region of the primary light device, is configured to reflect the primary light emitted by the light source, and
      (ii) the second functional region of the light wheel, in the utility light functional region of the utility light device, is transmissive to the reflected primary light.

2. The lighting apparatus as claimed in claim 1, wherein, in the light wheel:
   the first functional region is divided into a first sub-region having the at least one phosphor adapted to convert the wavelength of the primary light emitted by the light source, and a second sub-region configured to reflect the primary light emitted by the primary light source, and the second functional region is divided into a third sub-region having a filter transmissive at least to the light whose wavelength is converted by the at least one phosphor of the first sub-region, and a fourth sub-region transmissive to the primary light reflected by the second sub-region, the first and second sub-regions being arranged as segments of the first ring of the light wheel, and the third and fourth sub-regions being arranged as segments of the second ring of the light wheel.

3. The lighting apparatus as claimed in claim 1, wherein the first and second functional regions of the light wheel are overarched by the reflector device.

4. The lighting apparatus as claimed in claim 1, wherein only a portion of the first and second functional regions is overarched by the reflector device.

5. The lighting apparatus as claimed in claim 1, wherein the lighting apparatus has at least one second light source for emitting a second primary light onto the primary light device, the second primary light having a color different from the primary light of the at least one first light source.

6. The lighting apparatus as claimed in claim 5, wherein
the at least one first light source irradiates the primary light device from a side facing the reflector device,
the at least one second light source irradiates the primary light device from a side averted from the reflector device, and
the primary light functional region of the primary light device is, at least in one rotational position of the light wheel, transmissive to the light of the at least one second light source, and the utility light functional region of the utility light device is transmissive to the second primary light.

7. The lighting apparatus as claimed in claim 1, wherein the first focal point is located at or in the vicinity of the primary light functional region of the primary light device.

8. The lighting apparatus as claimed in claim 1, further comprising optics upstream, or optics downstream, or optics both upstream and downstream of the utility light functional region.

9. The lighting apparatus as claimed in claim 8, wherein any optics upstream of the utility light functional region is located at or in the vicinity of the second focal point, and a carrier of the light wheel is lowered at least at the utility light functional region.

10. The lighting apparatus as claimed in claim 1, wherein the second focal point is located at or in the vicinity of the utility light functional region of the utility light device.

11. The lighting apparatus as claimed in claim 1, wherein
the primary light functional region of the primary light device is, at least in one rotational position of the light wheel, transmissive to the primary light emitted by the at least one first light source, the lighting apparatus further comprising a common optical combiner downstream of the primary light device and of the utility light device.

* * * * *